United States Patent [19]

Dyment et al.

[11] 4,297,651

[45] Oct. 27, 1981

[54] METHODS FOR SIMULTANEOUS SUPPRESSION OF LASER PULSATIONS AND CONTINUOUS MONITORING OF OUTPUT POWER

[75] Inventors: John C. Dyment, Kanata; Kiuchi D. Chik, Nepean, both of Canada

[73] Assignee: Northern Telecom Limited, Montreal, Canada

[21] Appl. No.: 68,887

[22] Filed: Aug. 23, 1979

[51] Int. Cl.³ .............................................. H01S 3/19
[52] U.S. Cl. ........................ 331/94.5 H; 331/94.5 C; 350/96.11
[58] Field of Search ............... 331/94.5 H, 94.5 C, 331/94.5 S, 94.5 M, 94.5 T; 350/96.11, 96.12, 96.13

[56] References Cited

U.S. PATENT DOCUMENTS

| | | | |
|---|---|---|---|
| 4,054,363 | 10/1977 | Suematsu | 350/96.11 |
| 4,065,730 | 12/1977 | Minden | 331/94.5 H |
| 4,079,339 | 3/1978 | Kobayashi et al. | 331/94.5 C |
| 4,092,659 | 5/1978 | Ettenberg | 331/94.5 H X |
| 4,101,845 | 7/1978 | Russer | 331/94.5 H X |
| 4,111,521 | 9/1978 | Streifer et al. | 331/94.5 C X |
| 4,112,389 | 9/1978 | Streifer et al. | 331/94.5 H |
| 4,136,928 | 1/1979 | Logan et al. | 331/94.5 H X |
| 4,162,460 | 7/1979 | Gonda | 331/94.5 H |

OTHER PUBLICATIONS

H. Kressel et al., *Semiconductor Lasers and Heterojunction LEDs*, published 1977, Academic Press, p. 488.
Exxon, *Laser Focus*, May 1979, p. 77.

*Primary Examiner*—James W. Davie
*Attorney, Agent, or Firm*—Stuart L. Wilkinson

[57] ABSTRACT

Semiconductor lasers exhibit transient relaxation oscillations on start-up and specific lasers often exhibit sustained spontaneous pulsations caused probably by crystalline defects. These fluctuations are suppressed by coupling laser emission into a 0.3 to 2 cm. length of waveguide and coupling light reflected from the end of the waveguide back into the laser. Embodiments disclosed include one utilizing a length of optical fibre, while others are integrated optical structures.

6 Claims, 5 Drawing Figures

METHODS FOR SIMULTANEOUS SUPPRESSION OF LASER PULSATIONS AND CONTINUOUS MONITORING OF OUTPUT POWER

This invention relates to a device for stabilizing a semi-conductor laser output and to a laser package incorporating such a device.

Semiconductor injection lasers are greatly suited to high data rate fiber optic transmission systems since they can be modulated in the GHz range and have a narrow, well-defined output bandwidth.

Two difficulties of operating semiconductor lasers at high modulation rates are that (i) transient relaxation oscillations are generated when the laser is first switched on and (ii) in certain circumstances which have not yet been fully determined, semiconductor lasers exhibit sustained pulsations within a range of bias conditions. In the former case, the oscillation frequency is of the order of 1 GHz and the laser reaches a steady state within a few nanoseconds. In the latter case, the pulsations which have frequencies of from 0.2 to 2 GHz are believed to derive from crystalline defects including those defects which develop during laser operation. This explains why some lasers do not exhibit sustained pulsations at all, while others are subject to pulsations only as the devices age.

Chinone, et al (Applied Physics Letters, Vol. 33, Page 12, December 15, 1978) show that relaxation oscillations and sustained pulsations in a semiconductor laser output can be suppressed by feeding back into the laser resonant cavity light reflected from an external mirror located close to the laser output facet. Chinone et al demonstrate an arrangement for achieving oscillation suppression which uses a laser, a converging lens separate from the laser and a plane mirror separate from the lens. Light from the laser is rendered parallel at the converging lens and is transmitted through an air gap or the order of 1 cm. in length before being reflected back through the lens to the laser.

Although this arrangement is probably quite adequate for use in an experimental environment, the separate lens and mirror are not particularly suited to fabrication of a device package for installation in a fiber optic system since the lens and mirror are bulky and must be collimated; this is both difficult and time consuming. Kobayashi et al (U.S. Pat. No. 4,079,339) overcome these problems to some extent but their structure, which is characterized by a GRIN rod and optical fiber combination, would be rather bulky—the GRIN rod would have an outer diameter of the order of 1000–2000 μm—and still suffers from the disadvantage of two components—the GRIN rod and the fibre.

According to one aspect of the invention in a semiconductor laser package, there is provided a device for suppressing transient relaxation oscillations and sustained spontaneous pulsations of the semiconductor laser, said device comprising a 0.3 to 2 cm. length of dielectric optical waveguide, coupling means for reversibly coupling light from said laser into one end of the waveguide, the other end of the waveguide being adapted to reflect light from within the waveguide back along the waveguide.

Preferably the dielectric optical waveguide is an optical fiber, said coupling means being a bulb end formation at said one end.

The reflecting coating can be partially transmissive, the package further incorporating a detector mounted to receive light transmitted through the other end of the fiber. Alternatively the reflective coating can be in the form of a diffraction grating whereby to make the reflection wavelength dependent. Yet again, the coating can be a wavelength dependent dielectric coating for absorbing predetermined wavelengths from optical beams incident thereon.

Preferably a package incorporating the device defined hereinbefore has a flat open-topped housing in which the laser and the suppression device are mounted, a lid being welded onto an upstanding rim of the housing.

The suppression device can be formed as an integrated optical structure, the length of waveguide being part of a waveguide layer.

Embodiments of the invention will now be described by way of example with reference to the accompanying drawings in which.

Figure 1:
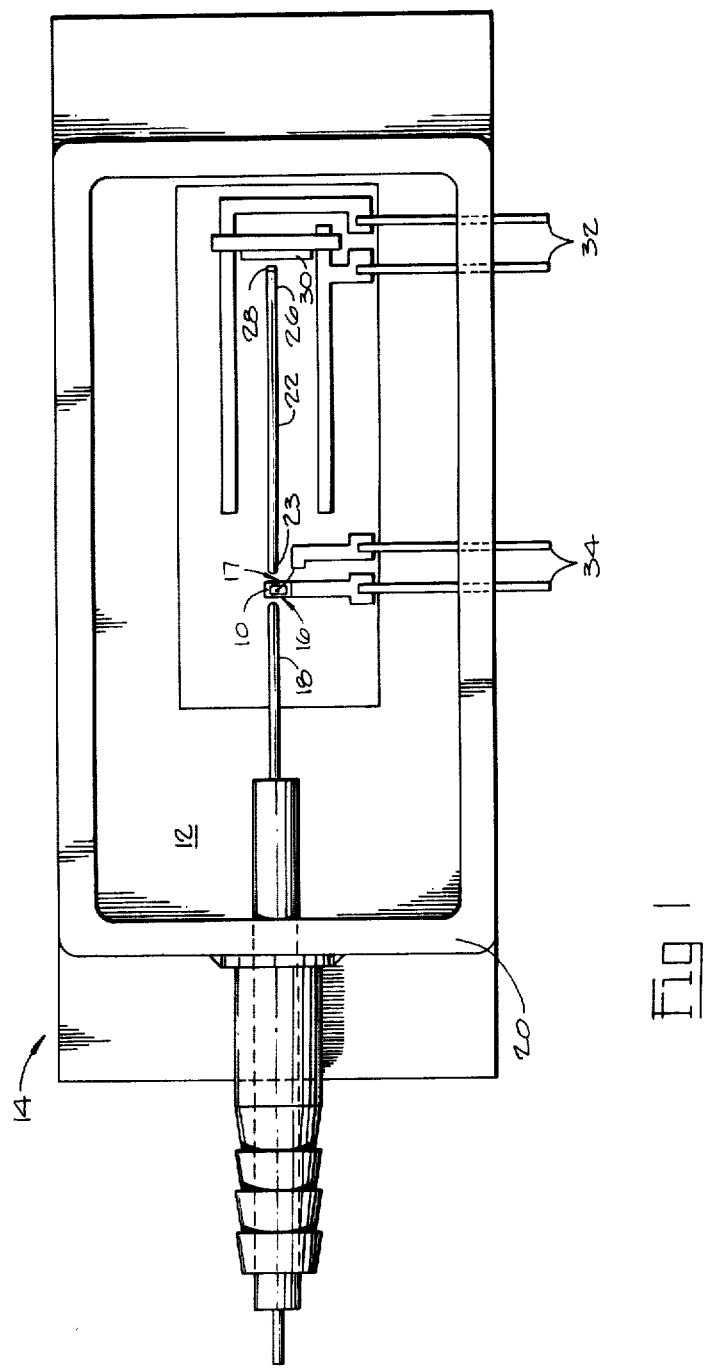
FIG. 1 shows in plan view a laser package incorporating a suppression device using an optical fibre.

Referring to FIG. 1, a double-heterostructure GaAlAs semiconductor laser 10 is mounted on a raised portion of the bottom wall 12 of a "flat pack" brass housing 14. Light from a front facet 16 of the laser is directed into a fiber 18 which extends through and is hermetically sealed within a bore through a side wall 20 of the housing and which forms part of a fiber optic transmission system (not shown).

As previously stated, semiconductor lasers show transient relaxation oscillations from start-up until they reach a steady state output—a period of a few nanoseconds. In addition to this, and depending, it is thought, on the laser crystalline integrity, certain lasers exhibit a sustained spontaneous pulsation in the frequency range 0.2 to 2 GHz, the frequency varying with the current bias applied.

Both of these oscillatory fluctuations are suppressed by the use of a 0.3 to 2 cm. fiber 22. In fabricating the device one end of the fiber is heated to the melting point of the glass. This generates a bulb formation 23 which functions as a converging lens. The other fiber end surface is plane and perpendicular to the fiber longitudinal axis. The surface has a reflective coating 28 which conveniently is about 10% transmissive so that a proportion of light incident on it from with the fiber 22 is transmitted to a photodiode detector 30 mounted to receive light from the fiber end.

Leads 32, 34 to the detector and laser, respectively, extend through, and are hermetically sealed by soldering within passages in walls of the package housing 14. Although the position of the fiber 22 is eventually fixed, it is initially flexible, enabling it to be disposed in a curved path if desired. This illustrates an advantage over separated lens and mirror since no linear collimation is required and so spatial arrangement of components within the device package can be optimized.

The explanation of pulsation suppression appears to be that before a pulse has time to develop beyond a rudimentary amplitude, it is being coupled into the fibre length 22 from a rear facet 17 of the laser and its reflection, on being coupled back into the laser, acts to quench the ensuing pulsations. The suppression is not, apparently, frequency dependent.

Although not specifically illustrated, the reflective coating can be formed as a diffraction grating on a rear surface of the fiber 22 inclined to the longitudinal fiber axis. By appropriate choice of the angle of inclination and diffraction line spacing, the grating can be made to reflect the laser peak output wavelength thus rendering the device wavelength selective. Alternatively, the fiber surface at end 26 is formed with a wavelength dependent dielectric coating which absorbs selected wavelengths from incident light, so rendering the device wavelength dependent.

Referring now to FIGS. 2 to 5, there are shown embodiments of the invention which use integrated optics fabrication technology. Integrated optical devices are the optical counterpart of integrated electronic circuits and details of their fabrication and techniques can be found, for example, in the following publications and will not be discussed in detail here. "Optically Pumped Grown GaAs Mesa Surface Laser" by F. A. Blum, et al in Applied Physics Letters, Vol. 24, No. 9, May 1, 1974; "Monolithic GaAs Injection Mesa Lasers With Grown Optical Facets" by F. A. Blum, et al in Applied Letters, Vol. 25, No. 10, November 15, 1974; "GaAs Integrated Optical Circuits by Wet Chemical Etching" by James L. Merz, et al in IEEE Journal of Quantum Electronics, Vol. QU-15, No. 2, February 1979; Monolithic Integration of an Embedded Stripe Laser and a Strip-Waveguide Modulator" by K. Ishikawa, et al in The Transactions of the IECE of Japan, Vol. E61, No. March 3, 1978; and "GaAs-$Al_xGa_{1-x}$ As Integrated Twin-Guide Lasers With Distributed Bragg Reflectors" by H. Kawaniski, et al in IEEE Journal of Quantum Electronics, February 1977.

Figure 2:
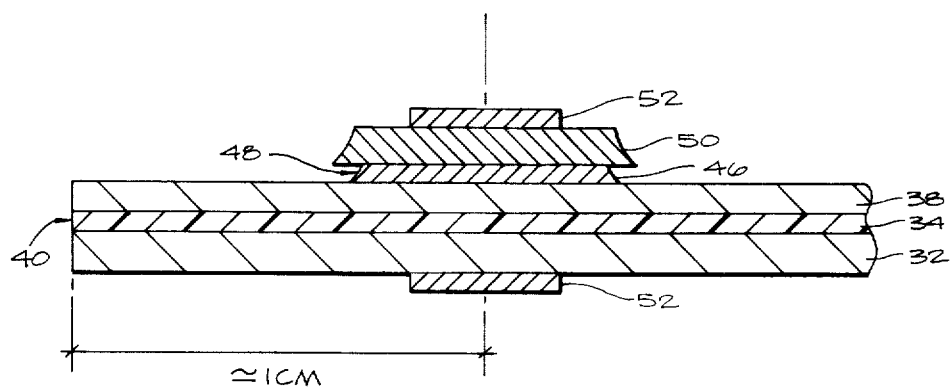
FIG. 2 shows in longitudinal section a suppression device of an integrated optical type.

Referring specifically to FIG. 2, there is shown in longitudinal section a GaAlAs double heterostructure laser including a substrate 32, a first confining layer 34 and a passive waveguide layer 38. These layers are cleaved at one end to produce a reflecting surface 40. Over the waveguide layer 38 is formed the active layer 46 of the laser. The active layer 46, which has inclined facets 48 produced by preferential etching, is spaced laterally about 1 cm. from the cleaved surface 40. A second confining layer 50 overlies the active layer 46. Typical parameters are as follows:

|  | Type | Width ($\mu$m) | Refractive Index |
|---|---|---|---|
| First Confining Layer | n-$Ga_{0.7}Al_{0.3}As$ | 2.0 | 3.38 |
| Waveguide Layer | n-$Ga_{0.8}Al_{0.2}As$ | 1.0 | 3.45 |
| Active Layer | p-GaAs | 0.2 | 3.59 |
| Second Confining Layer | p-$Ga_{0.5}Al_{0.5}As$ | 2.0 | 3.26 |

Appropriately positioned gold contact layers 52 are deposited on the top surface of the second confining layer 50 and the bottom surface of substrate 32 to permit application of drive current to the laser.

In use, lasing activity occurs in the active layer 46, with laser output coupling into the waveguide layer 38 coupling being enhanced by the inclined GaAs—air interfaces. Part of the light entering the waveguide layer propogates back to the surface 40 where it is reflected and coupled back through the waveguide layer into the laser active layer, coupling being enhanced by the difference in refractive indices of the layers 46 and 38. The reflected light functions to suppress the transient and sustained pulsations as explained previously.

Figure 3:
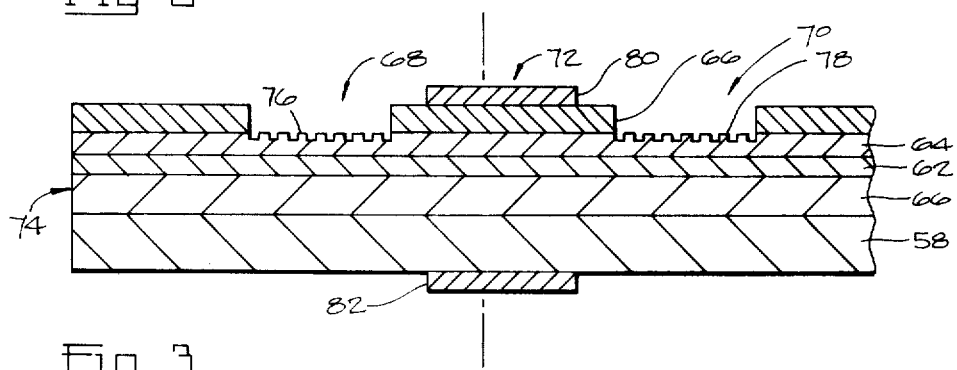
FIG. 3 shows in longitudinal section an alternative embodiment of a suppression device of an integrated optical type.

Referring now to FIG. 3, an alternative optical structure includes a substrate layer 68, a first confining layer 60, an active layer 62, a thin grating layer 64, and a second confining layer 66. Slots 68 and 70 are etched through to the second confining layer 66 to leave an upstanding mesa formation 72 one cm. distant from a cleaved end surface 74. At the base of respective slots diffraction gratings 76 and 78 are etched into the grating layer 64. Contact layers 80, 82 enabling application of a drive current are deposited on top and bottom surface of the mesa formation 72.

Typical parameters are as follows:

|  | Type | Width ($\mu$m) |
|---|---|---|
| Substrate | GaAa | — |
| 1st Confining Layer | n $Ga_{0.65}Al_{0.35}As$ | 2.0 |
| Active layers | p $Ga_{0.93}Al_{0.07}As$ | 0.1 |
| Grating layers | p $Ga_{0.85}Al_{0.15}As$ | 0.5 |
| 2nd Confining layers | p-$Ga_{0.65}Al_{0.35}As$ | 2.0 |

In use, the layer 62 has a dual role functioning both as the laser active layer in the region flanked by the gratings 76 and 78, and as a passive waveguide layer elsewhere. Laser emission couples readily between the layers 62 and 64. The gratings 76 and 78 function as so-called distributed Bragg reflectors (DBR) to define limits of the laser resonant cavity. Thus, a portion of the rearwardly (right to left in FIG. 3) directed light in the active layer 62 is reflected at the DBR 76. The remaining light is retained within the active layer and is reflected from the cleaved surface 74 back into the laser resonant cavity where it suppresses relaxation oscillations and sustained pulsations as previously explained. At the other end of the laser a proportion of the light is reflected at the DBR 78 while the remainder propogates along the layer 62 which, in conjunction with the grating layer 64, functions, here, as a passive waveguide layer. An advantage of this arrangement is that the DBR's are wavelength selective.

Figure 4:
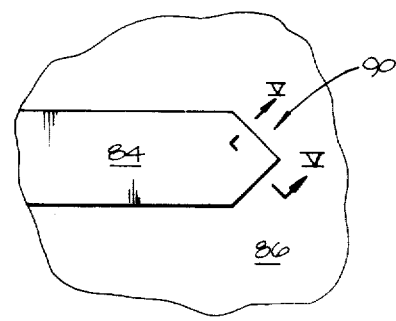
FIG. 4 shows in plan view part of an alternative embodiment of an integrated optical suppression device.
Figure 5:
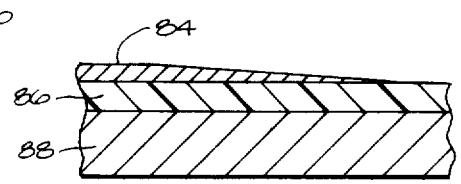
FIG. 5 is a cross-section on the line V—V of FIG. 4.

Referring now to FIGS. 4 and 5 there is shown an alternative to the cleaved surface (feature 40 in FIG. 2, feature 74 in FIG. 3) which is particularly adapted to an integrated optics structure. The waveguide layer is formed as a layer 84 of tantalum pentoxide ($Ta_2O_5$) over a layer 86 of silica ($SiO_2$) which itself overlies a gallium arsenide (GaAs) substrate 88. The $Ta_2O_5$ has a higher refractive index than either air or $SiO_2$ and thus functions as a waveguide. The $SiO_2$ is present to isolate light from the GaAs substrate 88 since this has a relatively high refractive index and would tend to capture light from the $Ta_2O_5$. The $Ta_2O_5$ layer is formed with a pointed end region 90 as shown in FIG. 4, the pointed end region gradually tapering to zero as shown in section in FIG. 5.

In operation, light propagating through the $Ta_2O_5$ layer (left to right as shown) experiences an increase in effective refractive index as the $Ta_2O_5$ layer becomes very thin, the light consequently undergoing complete internal reflection. Since the gallium arsenide wafer on which the optical circuit and other devices (not shown) are to be fabricated consequently does not have to be cleaved, the area of wafer available for optical circuit fabrication is consequently increased.

What is claimed is:

1. A semiconductor laser device adapted for suppression of transient relaxation oscillations and sustained spontaneous pulsations, the device comprising:

A semiconductor ship having a substrate, a first confining layer, a waveguide layer, an active layer and a second confining layer, the active layer and the second confining layer formed as a laser mesa, the mesa having a metal contact thereon, a corresponding surface area of the substrate also having a metal contact thereon, the waveguide being of higher refractive index than an underlying layer, the waveguide layer having one end of non-linear configuration, the waveguide being longer at a central region than at peripheral regions at said one end, and tapering gradually to zero thickness at said one end whereby collimated light directed along the waveguide towards said one end is reflected back therefrom and is returned to the laser active layer, such reflection occurring between 0.3 and 2 centimeters from the laser active layer.

2. A device as claimed in claim 1, wherein the waveguide layer is composed of tantalum pentoxide and the underlying layer is composed of silicon dioxide.

3. A semiconductor laser device adapted for suppression of transient relaxation oscillations and sustained spontaneous pulsations, the device comprising:

a semiconductor chip having a substrate, a first confining layer, a waveguide layer, an active layer, and a second confining layer, the active layer and the second confining layer formed as a laser mesa, the mesa having a metal contact thereon, a corresponding surface area of the substrate also having a metal contact thereon, the chip having an outer surface cleaved perpendicularly to the plane of the layers, the cleaved surface located between 0.3 and 2 centimeters from the laser active layer whereby to reflect light emitted from the laser and propagating through the waveguide layer back through the waveguide layer and into the laser active layer.

4. A laser device as claimed in claim 3 in which extremities of the laser active layer are angularly inclined to the plane of the layers whereby to enhance coupling of light from the active layer into the waveguide layer.

5. A laser device as claimed in claim 1 in which the refractive index of material of the active layer is greater than the refractive index of the material of the waveguide layer whereby to enhance coupling of light from the waveguide layer into the active layer.

6. A semiconductor laser device adapted for suppressing transient relaxation oscillations and sustained spontaneous pulsations, the device comprising:

a semiconductor chip having a substrate, a first confining layer, a waveguide layer substantially coplanar with a laser active layer, a grating layer and a second confining layer and in which device first and second distributed Bragg reflectors are formed in said grating layer whereby to define front and rear extremities of a laser active region in the laser active layer, the waveguide layer outside the active region functioning as a passive waveguide layer, said passive waveguide layer cleaved at a location laterally spaced from the active region to provide a reflecting surface perpendicular to the plane of the layers at a distance from 0.3 to 2 centimeters from the active region.

* * * * *